US011152228B2

(12) United States Patent
Yi

(10) Patent No.: US 11,152,228 B2
(45) Date of Patent: Oct. 19, 2021

(54) WAFER CLEANING APPARATUS AND CLEANING METHOD USING THE SAME

(71) Applicant: SK SILTRON CO., LTD., Gumi-si (KR)

(72) Inventor: Jae Hwan Yi, Gumi-si (KR)

(73) Assignee: SK Siltron Co., Ltd., Gumi-Si (KR)

( * ) Notice: Subject to any disclaimer, the term of this patent is extended or adjusted under 35 U.S.C. 154(b) by 121 days.

(21) Appl. No.: 15/974,415

(22) Filed: May 8, 2018

(65) Prior Publication Data

US 2019/0057883 A1    Feb. 21, 2019

(30) Foreign Application Priority Data

Aug. 18, 2017    (KR) ........................ 10-2017-0104711

(51) Int. Cl.
*H01L 21/67* (2006.01)
*H01L 21/677* (2006.01)
*B08B 9/093* (2006.01)

(52) U.S. Cl.
CPC .. *H01L 21/67051* (2013.01); *H01L 21/67057* (2013.01); *H01L 21/67751* (2013.01); *H01L 21/67757* (2013.01)

(58) Field of Classification Search
CPC ......... H01L 21/67051; H01L 21/67028; H01L 21/02052; H01L 21/02057; B08B 9/093; B08B 9/08; B08B 9/0813; B08B 3/024
See application file for complete search history.

(56) References Cited

U.S. PATENT DOCUMENTS

| 5,511,569 A | 4/1996 | Mukogawa | |
|---|---|---|---|
| 5,512,106 A * | 4/1996 | Tamai | B08B 7/00 134/7 |
| 6,199,568 B1 * | 3/2001 | Arai | B08B 3/102 134/186 |
| 6,416,587 B1 * | 7/2002 | Lu | B08B 3/102 134/2 |
| 6,752,897 B2 * | 6/2004 | Jang | H01L 21/67086 134/113 |

(Continued)

FOREIGN PATENT DOCUMENTS

| CN | 103707179 A | 4/2014 |
|---|---|---|
| JP | 61-179742 | 11/1986 |

(Continued)

OTHER PUBLICATIONS

Japanese Office Action dated Nov. 19, 2019 issued in Application No. 2018-090420.

(Continued)

*Primary Examiner* — Irina Graf
(74) *Attorney, Agent, or Firm* — KED & Associates LLP

(57) ABSTRACT

A wafer cleaning apparatus may include a cleaning tank, a support part and a cleaning unit installed to be capable of moving upward or downward into the cleaning tank, and configured to inject a cleaning solution onto an inner wall of the cleaning tank. The cleaning unit may include an injection pipe disposed adjacent to the inner wall of the cleaning tank and having a plurality of injection holes, and an injection nozzle coupled to the injection pipe and formed to be inclined such that a diameter of the injection hole decreases in a direction from the injection pipe toward the cleaning tank.

9 Claims, 7 Drawing Sheets

(56) References Cited

U.S. PATENT DOCUMENTS

| | | | | |
|---|---|---|---|---|
| 7,305,999 | B2* | 12/2007 | Henke | B08B 3/02 |
| | | | | 134/147 |
| 2009/0080879 | A1* | 3/2009 | Osawa | G03D 3/02 |
| | | | | 396/626 |
| 2014/0190530 | A1 | 7/2014 | Maeda et al. | |
| 2015/0128994 | A1 | 5/2015 | Kaneko et al. | |
| 2016/0045938 | A1* | 2/2016 | Aomatsu | B08B 3/08 |
| | | | | 134/26 |
| 2017/0333958 | A1* | 11/2017 | Mizota | A24C 5/3412 |

FOREIGN PATENT DOCUMENTS

| | | |
|---|---|---|
| JP | S62-281431 A | 12/1987 |
| JP | H08-051093 A | 2/1996 |
| JP | H08-195371 A | 7/1996 |
| JP | H09290199 A * | 11/1997 |
| JP | 2002-075951 A | 3/2002 |
| JP | 2006-351574 | 12/2006 |
| JP | 2010-094639 A | 4/2010 |
| JP | 2014-075438 | 4/2014 |
| JP | 2016-005000 | 1/2016 |
| KR | 10-2005-0044943 | 5/2005 |
| KR | 10-2014-0043866 | 4/2014 |
| KR | 10-2014-0084511 | 7/2014 |
| KR | 10-2015-0055590 | 5/2015 |

OTHER PUBLICATIONS

Korean Office Action dated Sep. 21, 2018 issued in Application No. 10-2017-0104711.

Japanese Office Action dated Apr. 16, 2019 issued in Application No. 2018-090420.

Korean Notice of Allowance dated Mar. 22, 2019 issued in Application No. 10-2017-0104711.

Chinese Office Action dated Nov. 27, 2020 issued in Application 201810687730.1 and English translation.

* cited by examiner

WAFER CLEANING APPARATUS AND CLEANING METHOD USING THE SAME

CROSS REFERENCE TO RELATED APPLICATION

This application claims priority under 35 U.S.C. § 119 to Korean Patent Application No. 10-2017-0104711 filed in Korea on 18 Aug. 2017 which is hereby incorporated in its entirety by reference as if fully set forth herein.

TECHNICAL FIELD

The present invention relates to a cleaning apparatus, and more particularly, to a wafer cleaning apparatus used in a cleaning or rinsing process of a wafer.

BACKGROUND

In general, a wafer is produced as a wafer for manufacturing a semiconductor device through a series of processes such as a slicing process, a grinding process, a lapping process, and a polishing process. Various foreign substances such as particles and impurities may be generated due to a wafer or an external environment in the course of the process to contaminate a surface of the wafer. Since such foreign substances may cause a decrease in yield of the semiconductor device, a cleaning process and a rinsing process are performed using a wafer cleaning apparatus in order to remove the foreign substances.

The cleaning process mainly uses a wet cleaning method using a clean solution, a wafer is put into a cleaning tank, and a clean solution such as standard cleaning-1 (SC1), standard cleaning-2 (SC2), piranha, phosphoric acid, etc. is injected into the cleaning tank to clean the wafer.

The rinsing process is a process of rinsing the cleaning solution remaining on a surface of the wafer after the cleaning process using a rinsing solution such as deionized water or an ozone water in a separate cleaning tank. Ultrasonic waves may be used together in the cleaning process and the rinsing process.

FIG. 1 is a cross-sectional view of a wafer cleaning apparatus of a general embodiment.

As shown in FIG. 1, when the cleaning process and the rinsing process are completed, a cleaning solution 5 or a cleaning solution 5 includes foreign substances P separated from a surface of a wafer W.

Therefore, the cleaning solution 5 or the rinsing solution 5 used in a predetermined number of times in the cleaning process and the rinsing process is drained to the outside through a drain pipe 20 under a cleaning tank 10, and a new uncontaminated cleaning solution or rinsing solution should be filled inside the cleaning tank 10.

When the foreign substances P are adhered to an inner wall of the cleaning tank 10 in the process of draining the cleaning solution 5 or the rinsing solution 5 to a lower portion of the cleaning tank 10, the foreign substances P may remain in the cleaning tank 10 and contaminate the wafer W even though a new cleaning solution 5 or a new rinsing solution 5 is filled.

SUMMARY

The present invention is directed to provide a wafer cleaning apparatus capable of removing foreign substances remaining on an inner wall of a cleaning tank generated in a cleaning process and a rinsing process, and a cleaning method of the wafer cleaning apparatus using the same.

The present invention provides a wafer cleaning apparatus including a cleaning tank; and a cleaning unit installed to be capable of moving upward or downward into the cleaning tank, and configured to inject a cleaning solution onto an inner wall of the cleaning tank.

The cleaning unit may include an injection pipe disposed adjacent the inner wall of the cleaning tank; a supply pipe configured to supply the cleaning solution to the injection pipe; and an elevating unit configured to move upward or downward the injection pipe.

The injection pipe may have a plurality of injection holes disposed along a horizontal direction.

The plurality of injection holes may be disposed outside the injection pipe to face the inner wall of the cleaning tank.

The plurality of injection holes may be disposed to be inclined at a predetermined angle with respect to a horizontal line of the injection pipe.

The elevating unit may include a wire connected to the injection pipe, and a pulling unit configured to adjust a length of the wire.

The cleaning tank may have a rectangular parallelepiped shape with an open top, and the injection pipe may have a rectangular shape.

The wafer cleaning apparatus may further include a drain pipe connected to a bottom surface of the cleaning tank; and a drain valve configured to control opening and closing of the drain pipe.

The cleaning unit may further include a supply valve connected to the supply pipe and configured to control a supply of a cleaning solution.

The wafer cleaning apparatus may further include a control unit configured to control an operation of the cleaning unit.

The control unit may open a drain valve and descend the cleaning unit, and open the supply valve to inject the cleaning solution to the inner wall of the cleaning tank at the time of cleaning.

Meanwhile, the present invention may include a cleaning tank, a cleaning unit installed to be capable of moving upward or downward into the cleaning tank, and configured to inject a cleaning solution onto the inner wall of the cleaning tank; and a control unit configured to descend the cleaning unit to control the cleaning solution to be injected when the cleaning solution inside the cleaning tank is being discharged or completely discharged.

Meanwhile, the present invention provides a cleaning method of a wafer cleaning apparatus comprising: discharging a cleaning solution accommodated inside a cleaning tank; descending a cleaning unit; injecting a cleaning solution onto the inner wall of the cleaning tank; and elevating the cleaning unit positioned at a lower portion of the inner wall of the cleaning tank to the upper portion of the cleaning tank.

The discharging of the cleaning solution may include opening a drain valve, and the descending of the cleaning unit may be associated with an operation of opening the drain valve.

The injecting of the cleaning solution may include opening a supply valve, and the cleaning solution may be injected until the cleaning unit is positioned at the lower portion of the inner wall of the cleaning tank.

Closing the supply valve may be performed before elevating the cleaning unit when the cleaning unit is positioned at the lower portion of the inner wall of the cleaning tank.

DETAILED DESCRIPTION OF THE EMBODIMENTS

Figure 1:
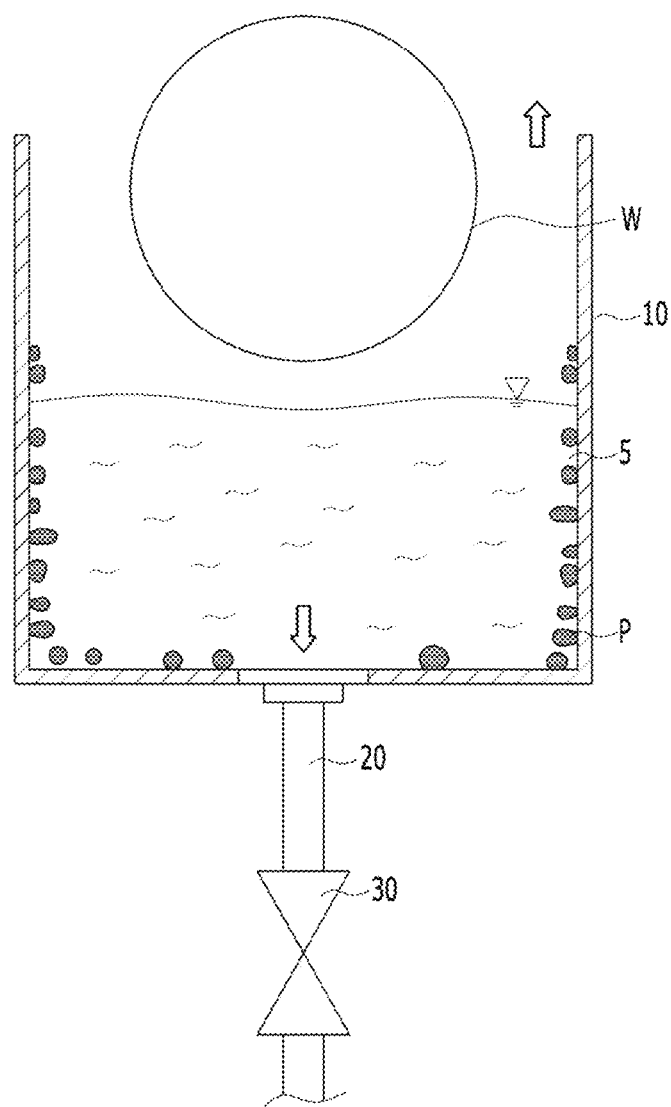
FIG. 1 is a cross-sectional view of a main part of a wafer cleaning apparatus of a general embodiment.

Hereinafter, embodiments will be shown more apparent through the description of the appended drawings and embodiments. In the description of the embodiment, when it is described that each layer (film), region, pattern, or structure is formed "above/on" or "below/under" a substrate, each layer (film), region, pad or pattern, includes being formed both "directly" or "indirectly (by interposing another layer)" "above/on" and "below/under". Also, a standard of above/on or below/under of each layer will be described with respect to the drawings.

Areas in the drawings may be exaggerated, omitted, or schematically described for a convenient and precise description. In addition, the size of each component does not fully match the actual size thereof. Further, like reference numbers represent like elements through description of the drawings. Hereinafter, an embodiment will be described with reference to the accompanying drawings.

A wafer cleaning apparatus of the present invention is used as a generic term for an apparatus capable of performing a cleaning process and a rinsing process for a wafer. Alternatively, the wafer cleaning apparatus of the present invention may refer to each individual apparatus that individually performs a cleaning process and a rinsing process of a wafer, or may refer to an integrated apparatus that performs both the cleaning process and the rinsing process.

Figure 2:
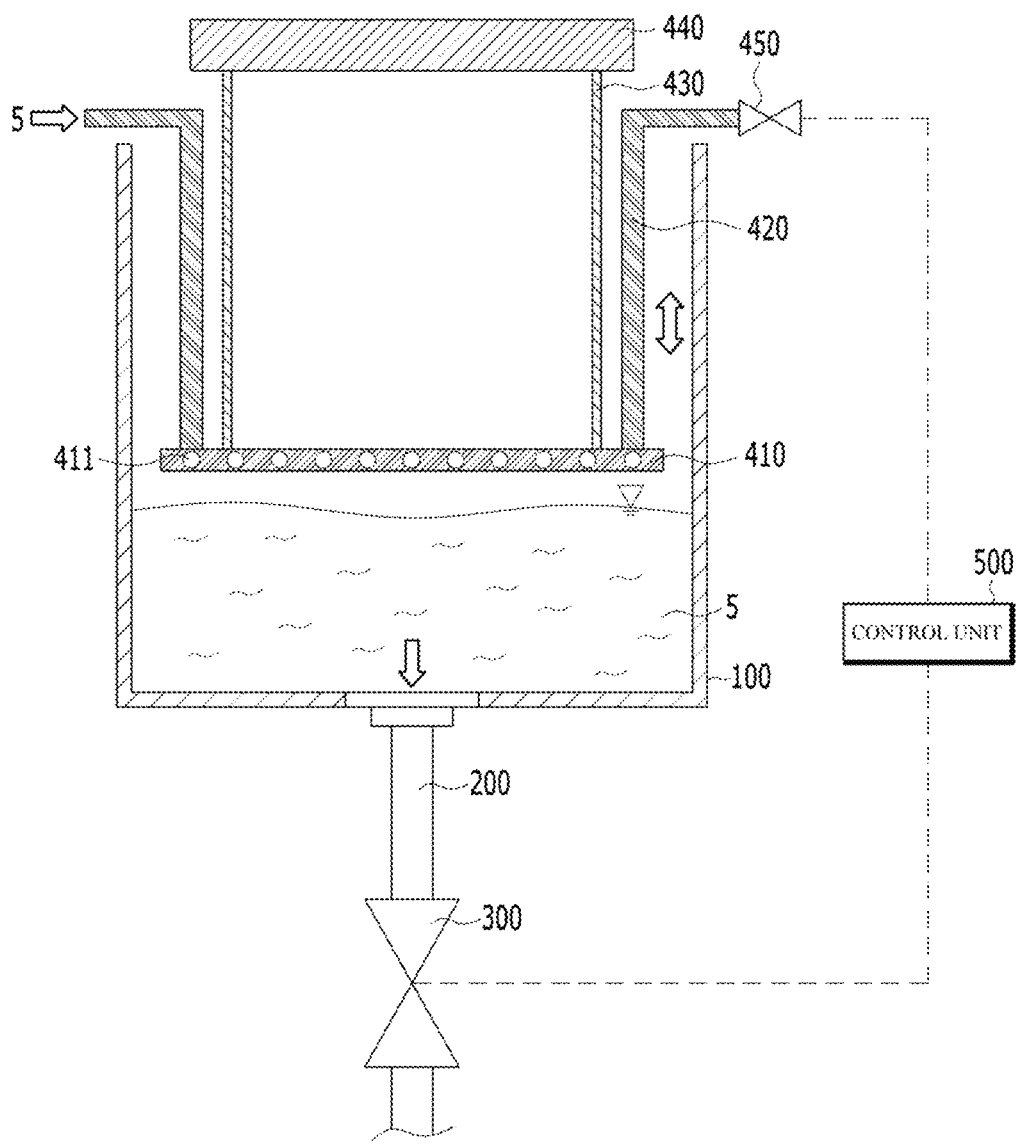
FIG. 2 is a cross-sectional view of a main part of a wafer cleaning apparatus according to an embodiment of the present invention.

FIG. 2 is a cross-sectional view of a main part of a wafer cleaning apparatus according to an embodiment of the present invention.

As shown in FIG. 2, a wafer cleaning apparatus 1 of the present embodiment may include a cleaning tank 100, a drain pipe 200, a drain valve 300, a cleaning unit 400, and a control unit 500.

The cleaning tank 100 may accommodate a cleaning solution or a rinsing solution (hereinafter, referred to as a cleaning solution), and may perform cleaning or rinsing (hereinafter, referred to as cleaning) on a wafer. A cleaning solution 5 may be deionized water (DIW) in which an etching solution such as acid or alkali is removed or various impurities are removed, and may be SC1 (DIW+$H_2O_2$+$NH_4OH$) used in an RCA cleaning method.

Since the cleaning tank 100 has a bath shape, the cleaning tank 100 may be called as a bath. For example, an empty space may be formed inside the cleaning tank 100 having a hexahedral shape with an open top. The cleaning tank 100 may be made of quartz, sapphire, or the like, which is excellent in corrosion resistance and ultrasonic transmission performance. A thickness of a bottom surface of the cleaning tank 100 may be 3 mm, 6 mm, or 9 mm, which is in proportion to a multiple of 3 of an ultrasonic frequency so that transmittance of ultrasonic waves generated in a ultrasonic wave generating part (not shown) is high.

The drain pipe 200 may be installed to be connected to the bottom surface of the cleaning tank 100 to drain the cleaning solution to the outside after the cleaning process is completed. For example, the drain pipe 200 may be disposed at a lower portion of a central region of the cleaning tank 100, and the drain pipe 200 may be disposed in plural as needed.

The drain valve 300 configured to control opening and closing of the drain pipe 200 may be installed at the lower portion of the drain pipe 200. The drain valve 300 may be operated to close during the cleaning process and to open at the time of draining the cleaning solution.

Although not shown in detail, the inside of the cleaning tank 100 may be further provided with a support part, a cleaning solution injecting part, and an ultrasonic wave generating part.

The support part may support a plurality of wafers W inside the cleaning tank 100 while performing cleaning. For example, the support part may include a plurality of bar-shaped members having a slot (not shown) for supporting a lower region of the plurality of wafers W (see FIG. 1), and may be called as a comb.

The support part may support the plurality of wafers W vertically erected inside the cleaning tank 100 while the plurality of bar-shaped members are disposed in parallel in the longitudinal direction. In addition, the support part may include a driving unit (not shown) to rotatably support the wafers W. Therefore, the support part may make the cleaning solution injected by rotating the wafer W in a circumferential direction during the cleaning process and ultrasonic waves transmitted from the ultrasonic wave generating part in contact with a surface of the wafer W.

Figure 7:
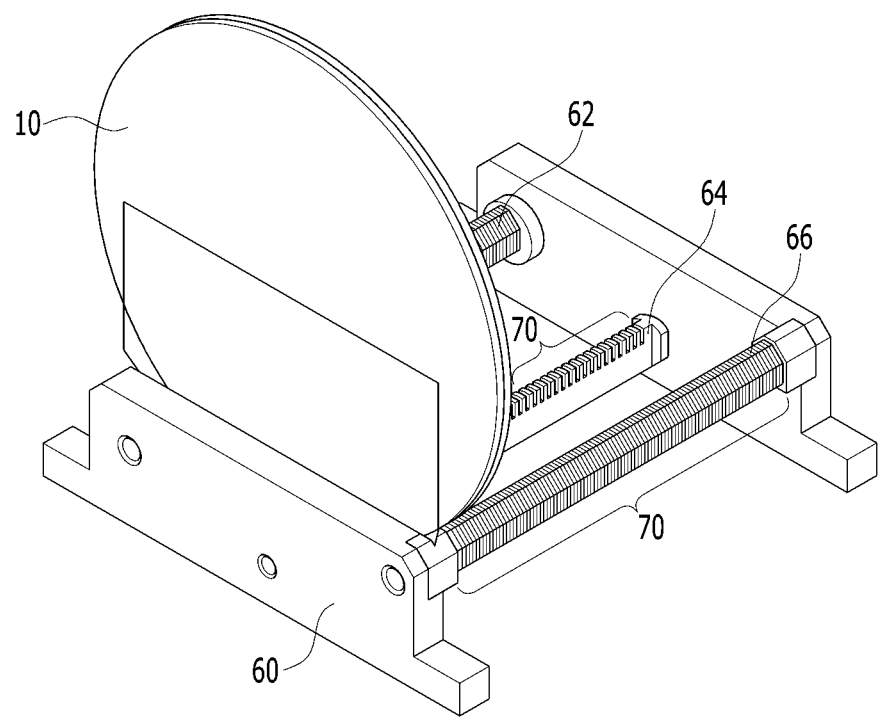
FIG. 7 is a view showing a support part including a plurality of bar-shaped members for supporting a plurality of wafers.

FIG. 7 shows one example of a support part that may support a plurality of wafers inside a cleaning tank FIG. 7 shows three combs 62, 64, 66 to support the wafers. Each of the combs is supported on both ends by a support part 60. Only one wafer W is shown in FIG. 7. Each of the combs 62, 64, 66 has a plurality of bar-shaped members 70 to support a lower region of the wafer W, such that the wafer is vertical erected.

The cleaning solution injecting part injects the cleaning solution 5 toward the wafer W from the upper or lower portion of an inner side of the cleaning tank 100. The cleaning solution injecting part may be called as an injection apparatus or an injector. The cleaning solution injecting part may be supplied with the cleaning solution 5 while being connected to a circulation pipe, and may be injected into the cleaning tank 100.

The ultrasonic wave generating part may be positioned at the lower portion of the cleaning tank 100 and generate ultrasonic waves toward the wafer W supported by the support part to transfer the ultrasonic waves to the wafer W. In the ultrasonic wave generating part, at least two ultrasonic waves having different frequencies may be generated to improve the cleaning ability. For example, the ultrasonic wave generating part may include at least one Mega-sonic having a frequency of 950 KHz.

The ultrasonic waves generated in the ultrasonic wave generating part are propagated in an upward direction through the cleaning solution 5 and transferred to a surface of the wafer W so that contaminants on the surface of the wafer W may be removed while acting together with the cleaning solution 5.

With such a configuration, the wafer cleaning apparatus 1 may clean foreign substances on the surface of the wafer W by injecting the cleaning solution 5 and generating the ultrasonic waves simultaneously.

Figure 3:
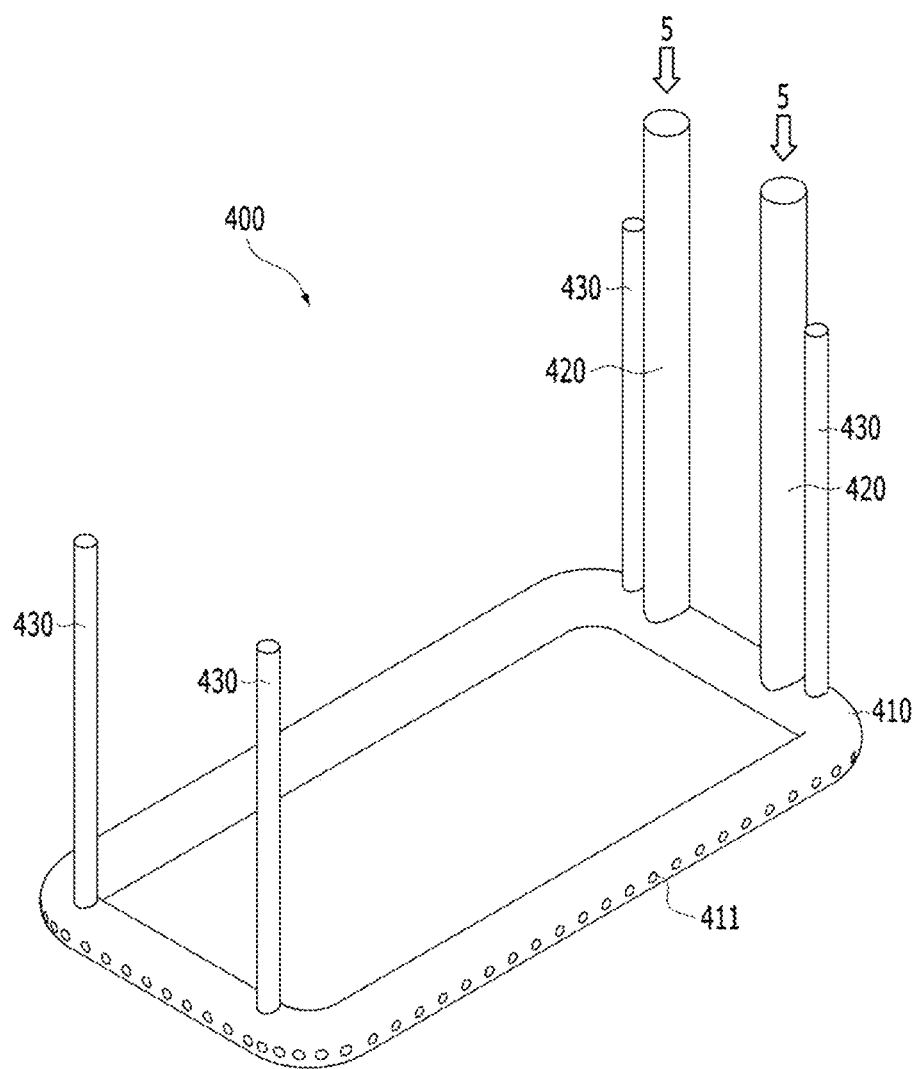
FIG. 3 is a perspective view of a cleaning unit of FIG. 2.
Figure 4:
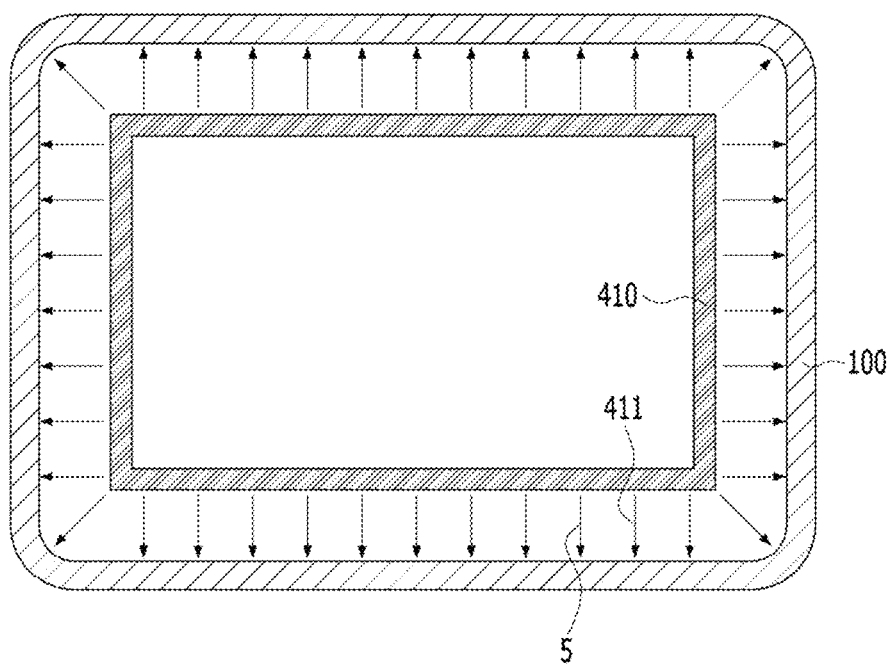
FIG. 4 is a plan view of FIG. 2 illustrating an operation of cleaning an inner wall of a cleaning tank by a cleaning unit.

FIG. 3 is a perspective view of a cleaning unit of FIG. 2, and FIG. 4 is a plan view of FIG. 2 illustrating a cleaning operation of the inner wall of the cleaning tank 100 by the cleaning unit 400.

As shown in FIGS. 2 to 4, the cleaning unit 400 may be installed inside the cleaning tank 100 to be capable of moving upward or downward, and may remove foreign substances adhered to the inner wall of the cleaning tank 100 by injecting the cleaning solution onto the inner wall of the cleaning tank 100.

Here, a variety of chemical solutions capable of removing foreign substances may be used as the cleaning solution. For example, the cleaning solution may be DIW, but is not limited thereto and may be modified.

The cleaning unit 400, more particularly, may include an injection pipe 410, a supply pipe 420, and an elevating unit.

The injection pipe 410 may be disposed adjacent to the inner wall of the cleaning tank 100 to inject the cleaning solution toward the inner wall of the cleaning tank 100. The injection pipe 410 may have a shape corresponding to the shape of the cleaning tank 100. For example, when the cleaning tank 100 is a rectangular parallelepiped shape, the injection pipe 410 may have a configuration in which pipes are connected to each other so as to be a hollow rectangular shape and disposed in the rectangular shape.

The injection pipe 410 may be disposed to uniformly clean the inner wall of the cleaning tank 100 while being concentrically formed with the cleaning tank 100 in a state of being spaced apart from the cleaning tank 100 by a predetermined distance.

The injection pipe 410 may have a plurality of injection holes 411 disposed along the horizontal direction. The plurality of injection holes 411 may be disposed outside the injection pipe 410 so as to face the inner wall of the cleaning tank 100 as shown in FIGS. 3 and 4. Accordingly, contaminants may be removed from the inner wall of the cleaning tank 100 while injecting the cleaning solution passed through the injection hole 411 onto the inner wall of the cleaning tank 100.

The supply pipe 420 may supply the cleaning solution to the injection pipe 410 described above. The supply pipe 420 may communicate with the injection pipe 410 and have a predetermined length, and may be supplied with the cleaning solution from the outside to transfer the cleaning solution to the injection pipe 410. For example, the supply pipe 420 may include at least one pipe connected to the upper portion of the injection pipe 410. The supply pipe 420 may be in plural and may include a pipe in a straight or curved shape.

The supply pipe 420 may be provided with a supply valve 450 configured to control the supply of the cleaning solution. That is, when the supply valve 450 is opened, the cleaning solution may be automatically supplied to the supply pipe 420, and when the supply valve 450 is closed, the supply of the cleaning solution may be stopped.

The elevating unit may move upward or downward the injection pipe 410 described above inside the cleaning tank 100.

For example, the elevating unit may include a wire 430 connecting the injection pipe 410 and a pulling unit 440 including a motor for adjusting the length of the wire 430 by winding or unwinding the wire 430. The elevating unit is a basic example which may change the vertical position of the injection pipe 410, and may be modified into various forms.

When the cleaning process is performed, the elevating unit may move upward the cleaning unit 400, for example, the injection pipe 410 to be positioned at the upper portion of the cleaning tank 100 so as not to interfere with the cleaning process.

In addition, the cleaning unit 400 may be descended into the cleaning tank 100 to remove the foreign substances from the inner wall of the cleaning tank 100 after the cleaning solution is being drained or completely drained to the drain pipe 200 after the cleaning process.

Here, the elevating unit may gradually descend the injection pipe 410 in a vertical direction, and the cleaning solution may be uniformly injected from the upper portion to the lower portion of the inner wall of the cleaning tank 100, and thus cleaning can be performed.

The control unit 500 may automatically control the operation of the cleaning unit 400 described above.

For example, the control unit 500 may control a series of operations for opening the drain valve 300 of the drain pipe 200, descending the cleaning unit 400, opening the supply valve 450, and injecting the cleaning solution onto the inner wall of the cleaning tank 100 at the timing of cleaning.

The control unit 500 may link the operation of descending the cleaning unit 400 with the operation of opening the drain valve 300, and link the operation of injecting the cleaning solution with the operation of opening the supply valve 450.

In addition, the control unit 500 may control such that the cleaning solution is injected until the cleaning unit 400 is positioned at the lower portion of the inner wall of the cleaning tank 100.

As described above, according to the wafer cleaning apparatus of an embodiment of the present invention, when the cleaning solution or the rinsing solution used in the cleaning process or the rinsing process is being drained or completely drained, foreign substances remaining on the inner wall of the cleaning tank are removed by using the cleaning unit, cleaning of the cleaning tank may be performed, and thus wafer cleaning efficiency can be enhanced.

Figure 5:
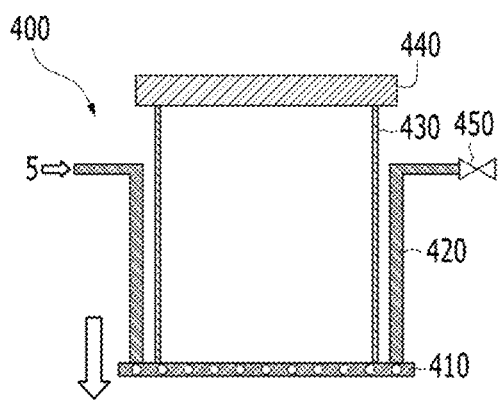
FIG. 5 is a cross-sectional view of a main part of a wafer cleaning apparatus according to another embodiment of the present invention.
Figure 5:
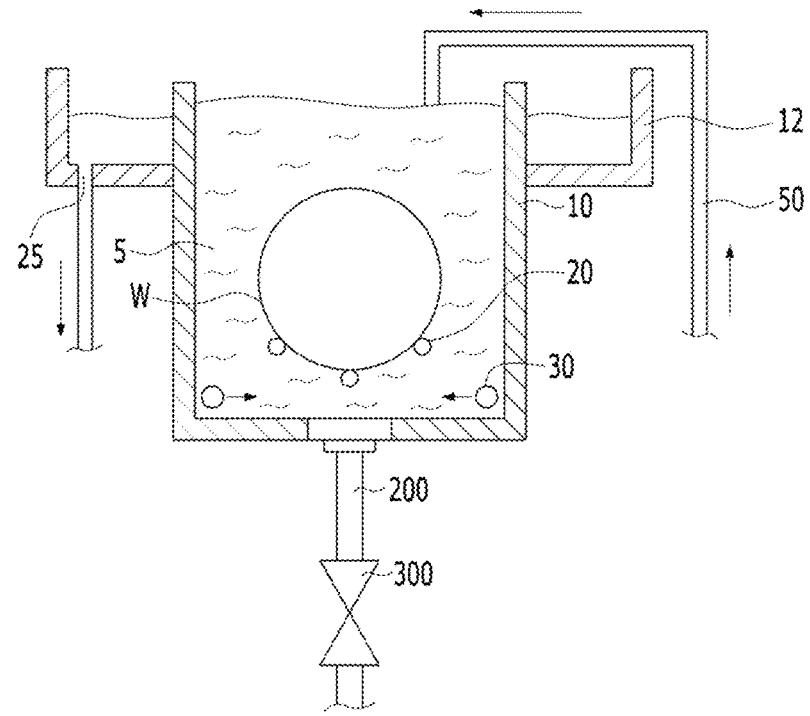
Figure 6:
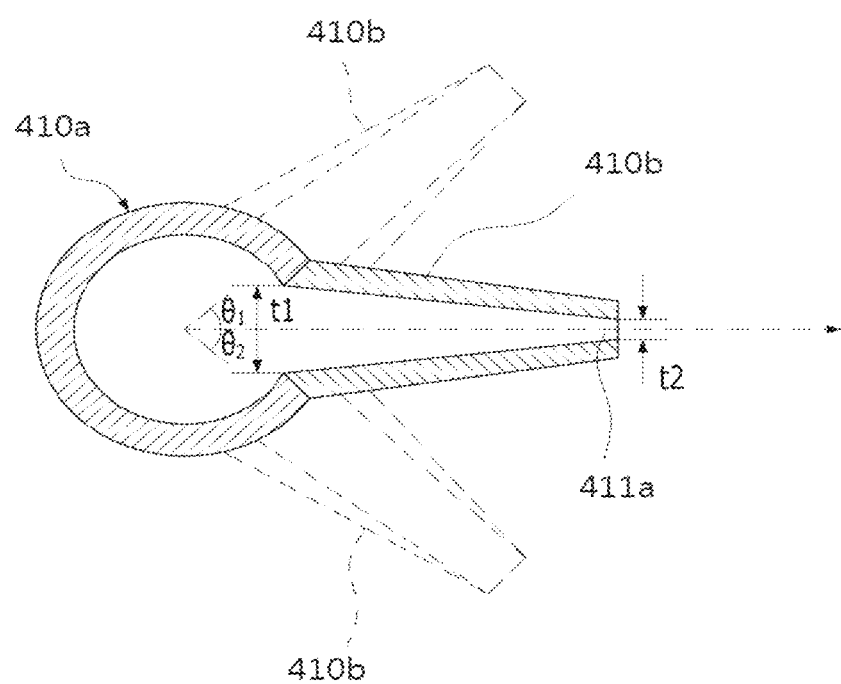
FIG. 6 is a cross-sectional view illustrating a shape of disposing injection holes (injection nozzles) of a cleaning unit.

FIG. 5 is a cross-sectional view of a main part of a wafer cleaning apparatus according to another embodiment of the present invention, and FIG. 6 is a cross-sectional view illustrating a disposing shape of injection holes (injection nozzles) of a cleaning unit.

Hereinafter, the present invention will be described mainly on modified embodiments which are different from the above-described embodiments. Since the cleaning solution 5 is rapidly drained to the drain pipe 200 positioned at the lower portion of the cleaning tank 100, the wafer cleaning apparatus (see FIG. 2) of the above-described embodiment may be called as a quick drain type.

As shown in FIG. 5, a wafer cleaning apparatus 1a according to another embodiment is a type that discharges or circulates the cleaning solution 5, for example, SC1 overflowing from inside a cleaning tank 10, and may be called as an overflow type.

In the wafer cleaning apparatus 1a of the present embodiment, an external cleaning tank 12 may be further installed so as to accommodate and circulate the cleaning solution 5 overflowing from the cleaning tank 10 at the outside of the upper portion of the cleaning tank 10. A discharge pipe 25 for discharging the cleaning solution 5 overflowing from the cleaning tank 10 may be formed at the lower portion of the external cleaning tank 12. The discharge pipe 25 may be connected to a circulation pipe 50 so that the cleaning solution introduced to the external cleaning tank 12 may be supplied again to an upper region of the cleaning tank 10 along the circulation pipe 50.

As described above, when the cleaning solution 5 overflows into the external cleaning tank 12 while performing the cleaning process inside the cleaning tank 100, the cleaning solution 5 may be recycled such that the cleaning solution 5 is introduced again into the cleaning tank 10 along the circulation pipe 50 and is reused.

The wafer cleaning apparatus 1a of the present embodiment may also perform cleaning on the inner wall of the cleaning tank 10 by applying the cleaning unit 400 described above. That is, the cleaning unit 400 may be positioned at the upper portion of the cleaning tank 10 while performing the cleaning process. When the cleaning process is performed, the cleaning unit 400 may descend into the cleaning tank 10 and the cleaning solution may be injected onto the inner wall of the cleaning tank 10, and thus foreign substances can be removed.

Here, the injection pipe 410 of the cleaning unit 400 may be manufactured to descend to a position, which does not interfere with the cleaning solution injection pipe 410 positioned inside the cleaning tank 10, and to appropriately modify a shape so as not to interfere with the configuration positioned inside the cleaning tank 10.

As shown in FIG. 6, a plurality of injection holes 411a for injecting the cleaning solution from the cleaning unit 400 may be disposed to be inclined at predetermined angles θ1 and θ2 with respect to a horizontal line of the injection pipe 410a. That is, the injection hole may be disposed at the injection pipe 410a so as to be angularly adjusted to inject the cleaning solution toward the upper portion θ1 or the lower portion θ2 with respect to the horizontal line. The injection holes 411a may be disposed in a row in the injection pipe 410a but may have a different position such as a diagonal line, a curve, waveforms, or the like, and may be modified to form a plurality of rows.

In addition, the plurality of injection holes 411a formed in the injection pipe 410a may be modified to be included in an injection nozzle 410b projectively coupled to the injection pipe so as to increase an injecting pressure and linearity of the cleaning solution. The injection nozzle 410b is formed such that a diameter of the injection hole 411a gradually decreases from the inside to the outside of the injection pipe 410a (t1>t2), and thus the injecting pressure and the linearity can be further increased. When a position, a shape, or the like of the injection hole 411a is appropriately modified as in the present embodiment, cleaning performance may be further improved.

Hereinafter, a cleaning method using the wafer cleaning apparatus of the present invention will be described with reference to the above-mentioned drawings.

When the cleaning process for the wafer is completed, discharging the cleaning solution 5 accommodated in cleaning tanks 100 and 10 is performed. Here, the discharging of the cleaning solution 5 may be starting to expose a wall surface of a predetermined height from the cleaning tanks 100 and 10 while discharging the cleaning solution 5 to the outside through the drain pipe 200, or a state in which discharging is fully completed and thus the inner walls of the cleaning tanks 100 and 10 are completely exposed.

The discharging of the cleaning solution 5 may include opening the drain pipe 200 by opening the drain valve 300, and the operation described above may be controlled by the control unit 500.

After the discharging of the cleaning solution 5, descending the cleaning unit 400 is performed. In the descending of the cleaning unit 400, the control unit 500 may calculate the appropriate timing in conjunction with the operation of opening the drain valve 300 described above to determine the descending time.

And then, injecting the cleaning solution 5 for cleaning the cleaning tanks 100 and 10 onto the inner walls of the cleaning tanks 100 and 10 is performed. The cleaning solution 5 may be the same as the cleaning solution 5 used at the time of cleaning, or may be a different material.

The injecting of the cleaning solution 5 includes opening the supply valve 450. When the supply valve 450 is opened, the cleaning solution 5 introduces into the supply pipe, and thus the cleaning solution 5 can be injected through the injection holes 411 and 411a.

In the injecting of the cleaning solution 5, the cleaning solution 5 may be injected until the cleaning unit 400 is positioned at the lower portions of the inner walls of the cleaning tanks 100 and 10. The cleaning unit 400 may uniformly clean the inner walls of the cleaning tanks 100 and 10 while vertically downward moving to the inner walls of the cleaning tanks 100 and 10 by the elevating unit.

When the cleaning unit 400 is positioned at the lower portions of the inner walls of the cleaning tanks 100 and 10, the supply valve 450 may be closed to stop the injecting of the cleaning solution 5.

When the injecting of the cleaning solution 5 is stopped, elevating the cleaning unit 400 is performed. In this step, the cleaning unit 400 positioned at the lower portions of the inner walls of the cleaning tanks 100 and 10 is elevated to upper portions of the cleaning tanks 100 and 10.

In addition, the cleaning unit 400 may perform only one time the cleaning from the top to the bottom at the time of cleaning the inner walls of the cleaning tanks 100 and 10. However, the cleaning unit 400 may be reciprocated several times vertically as necessary, or may be controlled to inject the cleaning solution 5 for a longer period of time at inner wall positions of the cleaning tanks 100 or 10 with a large amount of foreign substances.

As described above, according to the cleaning method of the wafer cleaning apparatus of the present invention, since the cleaning tank may be cleaned, by removing foreign substances remaining on the inner wall of the cleaning tank using the cleaning unit when the cleaning solution or the rinsing solution used in the cleaning process and the rinsing process is being drained or completely drained, the wafer cleaning efficiency can be improved.

As described above, according to a wafer cleaning apparatus and a cleaning method of the wafer cleaning apparatus using the same of the present invention, a cleaning tank can be cleaned by removing foreign substances remaining on an inner wall of the cleaning tank using a cleaning unit when a cleaning solution or a rinsing solution used in a cleaning process and a rinsing process is being drained or completely drained, and thus wafer cleaning efficiency can be improved.

The features, structures, effects and the like described in the embodiments are included in at least one embodiment of the present invention and are not necessarily limited to only one embodiment. Furthermore, the features, structures, effects and the like illustrated in the embodiments may be combined or modified by other persons skilled in the art to which the embodiments belong. Accordingly, it is to be understood that such combination and modification are included in the scope of the present invention.

DESCRIPTION OF REFERENCE NUMERALS

| | |
|---|---|
| 1: wafer cleaning apparatus | 100: cleaning tank |
| 200: drain pipe | 300: drain valve |
| 400: cleaning unit | 410, 410a: injection pipe |
| 411, 411a: injection hole | 410b: injection nozzle |
| 420: supply pipe | 430: wire |
| 440: pulling unit | 450: supply valve |
| 500: control unit | |

What is claimed is:

1. A wafer cleaning apparatus, comprising:
a cleaning tank;
a support part including a plurality of bar-shaped members for supporting a plurality of wafers to be erected vertically inside the cleaning tank;
a cleaning unit installed to be capable of moving upward or downward into the cleaning tank, and configured to inject a cleaning solution onto an inner wall of the cleaning tank; and
a control unit configured to control an operation of the cleaning unit,
wherein the cleaning unit comprises:
an injection pipe disposed adjacent to the inner wall of the cleaning tank and having a plurality of injection holes; and
a plurality of injection nozzles, each of the injection holes is coupled to a corresponding injection nozzle, and each of the injection nozzles has a tapered shape, such that its inner diameter decreases from an inlet at the injection pipe to an outlet of the injection nozzle facing toward the cleaning tank,
wherein the control unit is configured to control a series of operations for opening a drain valve of a drain pipe, descending the cleaning unit, and opening a supply valve to supply the cleaning solution to the injection pipe for injection of the cleaning solution onto the inner wall of the cleaning tank at a timing of cleaning,
wherein the control unit is configured to link the operation of descending the cleaning unit with the operation of opening the drain valve, and
wherein the control unit is configured to control such that the cleaning solution is injected until the cleaning unit is positioned at a lower portion of the inner wall of the cleaning tank.

2. The wafer cleaning apparatus of claim 1,
wherein the cleaning unit further comprises:
a supply pipe configured to supply the cleaning solution to the injection pipe; and
an elevating unit configured to move the injection pipe upward or downward.

3. The wafer cleaning apparatus of claim 2,
wherein the elevating unit comprises:
a wire connected to the injection pipe; and
a pulling unit configured to adjust a length of the wire.

4. The wafer cleaning apparatus of claim 1, wherein the plurality of injection holes are configured to be disposed along a horizontal direction.

5. The wafer cleaning apparatus of claim 4, wherein the plurality of injection holes are disposed outside the injection pipe to face the inner wall of the cleaning tank.

6. The wafer cleaning apparatus of claim 5, wherein the plurality of injection holes are disposed to be inclined at a predetermined angle with respect to a horizontal line of the injection pipe.

7. The wafer cleaning apparatus of claim 5, wherein the cleaning tank has a rectangular parallelepiped shape with an open top, and the injection pipe has a rectangular shape.

8. The wafer cleaning apparatus of claim 7, wherein the drain pipe is connected to a bottom surface of the cleaning tank, and
the drain valve is configured to control opening and closing of the drain pipe.

9. The wafer cleaning apparatus of claim 8, wherein the supply valve is connected to a supply pipe.

* * * * *